United States Patent
Sjödin et al.

(10) Patent No.: US 6,532,438 B2
(45) Date of Patent: *Mar. 11, 2003

(54) METHOD AND SYSTEM FOR IMPROVING A TRANSISTOR MODEL

(75) Inventors: Håkan Sjödin, Knivsta (SE); Hans Hjelmgren, Bromma (SE); Lars-Peter Jacobson, Sundbyberg (SE); Anders Eklund, Sundbyberg (SE)

(73) Assignee: Telefonaktiebolaget LM Ericsson, Stockholm (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,605

(22) Filed: Nov. 30, 1998

(65) Prior Publication Data

US 2002/0013682 A1 Jan. 31, 2002

(30) Foreign Application Priority Data

Dec. 1, 1997 (SE) .................................. 9704465

(51) Int. Cl.$^7$ ........................... G06F 17/50; G06G 7/62; H01L 27/70
(52) U.S. Cl. ............................. 703/13; 703/14; 257/592
(58) Field of Search ........................ 703/13–14; 257/592

(56) References Cited

U.S. PATENT DOCUMENTS 3,683,417 A    8/1972   Gummel

FOREIGN PATENT DOCUMENTS

SE    512 661    4/2000

OTHER PUBLICATIONS

Neaves et al.; "Characterization of low VAR bipolar transistors using a revised SPICE simulator"; IEEE Bipolar/BiCMOS Cir. & Tech. Meeting; pp. 229–232, Oct. 1992.*

Yuan et al.; "An improved Early voltage model for advanced bipolar transistors"; IEEE Tran. Elect. Dev.; pp. 179–182, Jan. 1991.*

Huang et al.; "Gummel–Poon model for single and double heterojunction bipolar transistors"; IEE Proc. Cir., Dev. & Sys.; pp. 165–169, Apr. 1991.*

(List continued on next page.)

Primary Examiner—Hugh M. Jones
(74) Attorney, Agent, or Firm—Burns, Doane, Swecker & Mathis, L.L.P.

(57) ABSTRACT

An improved system for simulating bipolar transistors with a variation in Early voltage as a function of collector/emitter bias voltage is disclosed. The simulation is based upon a standard Gummel-Poon model and is improved by an Early voltage extension, where the constant Early voltage is replaced by an Early voltage that is divided into several regions. The Early voltage is adjusted to fit the actual variations of the measured Early voltage characteristics of a bipolar transistor. The Early voltage within each region is used for calculating the bipolar transistors base charge which then is used to simulate the performance of the bipolar transistor. The regions may be linked together by choice of boundary conditions.

20 Claims, 7 Drawing Sheets

OTHER PUBLICATIONS

Krowne et al.; "Early voltage in heterojunction bipolar transistors: quantam tunneling and base recombination effects"; Solid–State Electyronics; pp. 1979–1991, Dec. 1995.*

IEEE Journal of Solid–State Circuits, vol. 31, No. 10, Oct. 1996, Colin C. McAndrew et al., "VBIC95, The Vertical Bipolar Inter–Company Model", p. 1476–p. 1483.

IEEE Transactions on Electron Devices, vol. ED–32, No. 11, Nov. 1985, H.C. DeGraaff et al., "New Formulation of the Current and Charge Relations in Bipolar Transistor Modeling for CACD Purposes", p. 2415–p. 2419.

IEEE Transactions on Electron Devices, vol. 38, No. 1, Jan. 1991, J. S. Yuan et al., "An Improved Early Voltage Model for Advanced Bipolar Transistors" p. 179–p. 182.

* cited by examiner

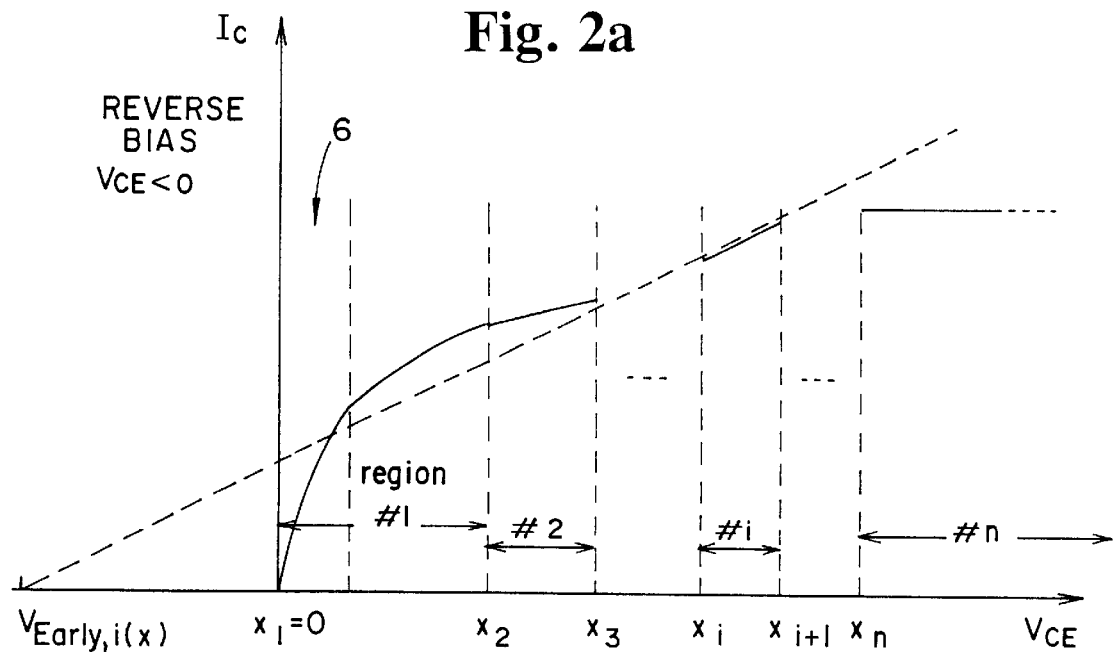
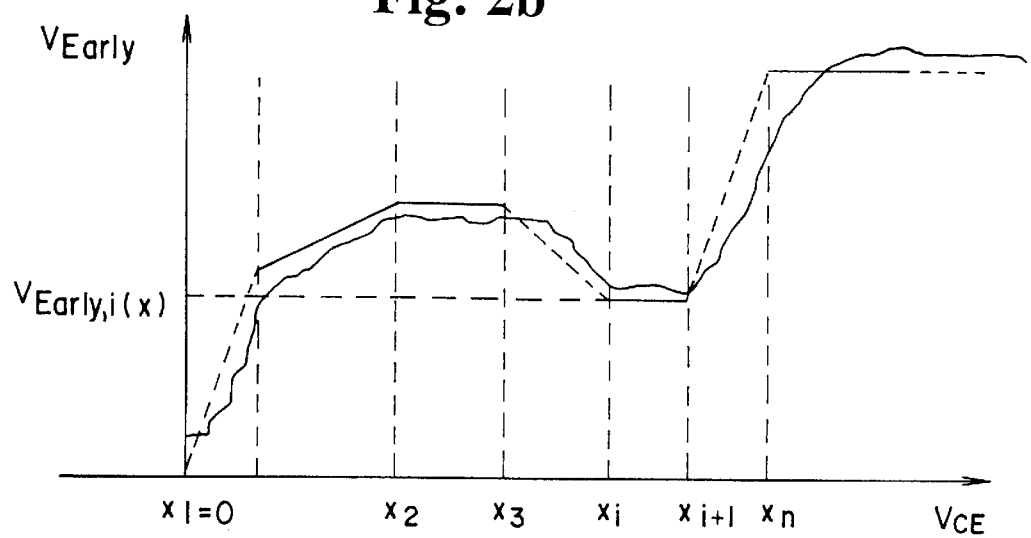

METHOD AND SYSTEM FOR IMPROVING A TRANSISTOR MODEL

This application claims priority under 35 U.S.C. §§119 and/or 365 to 9704465-5 filed in Sweden on Dec. 1, 1997; the entire content of which is hereby incorporated by reference.

TECHNICAL FIELD OF THE INVENTION

This invention relates in general to the field of electronic systems and more particular to an improved simulation system for bipolar transistors.

BACKGROUND OF THE INVENTION

The cost and length of time required to produce an integrated circuit prohibits cut-and-try methods of varying component values and testing the resulting circuit until the desired performance is achieved. A more common way to test and evaluate circuit designs is to simulate the circuit design in a computer utilising mathematical models that characterise the different components incorporated in the circuit. The basic mathematical model characterising the behaviour of a bipolar transistor is the Gummel-Poon model. This model is described in U.S. Pat. No. 3,683,417 by Gummel where the fundaments of the Gummel-Poon model is outlined. The model assumes a constant Early voltage, independent of bias conditions and substrate potential.

In the Standard Gummel-Poon model, the Early effect and the high current injection is included in the current source $I_{CT}$ between the emitter and collector by introducing a variable for the base charge $Q_B$, $$I_{CT} = I_{SS} \cdot \frac{Q_{B0}}{Q_B}(\exp(V_{B'E'}/V_T) - \exp(V_{B'C'}/V_T)), \quad (1)$$

where $V_{B'C'}$ and $V_{B'E'}$ are the internal junction voltages, $I_{SS}$ is the conventional intercept current with the y-axis in a Gummel plot, commonly called the saturation current, and $V_T$ is the thermal voltage.

The normalised majority base charge $q_b$ is defined as, $$q_b = Q_B/Q_{B0}, \quad (1a)$$

where $Q_B$ is the actual base charge and $Q_{B0}$ is the zero-bias majority base charge.

The base charge $q_b$ is usually described with two variables:

$$q_b = \frac{q_1}{2} + \sqrt{\frac{q_1^2}{4} + q_2}, \quad (2a)$$

where a first part of the base charge $q_1$ is the variable that is modified, according to the invention, to enhance the Early voltage behaviour. A second part of the base charge $q_2$ describes high injection of charges into the base, which can be neglected at low and intermediate current levels. An approximation of the base charge $q_b$ can therefore be used at low and intermediate current levels and for that purpose equation (2b) is approximated to, $$q_b \approx q_1. \quad (2b)$$

In the standard Gummel-Poon model, the Early voltages are assumed to be constant, independent of any variable, and modelled by the two parameters $V_{AF0}$ and $V_{AR}$, the forward and reverse Early voltages, $$\frac{1}{q_b} = 1 - \left(\frac{V_{B'C'}}{V_{AFO}} + \frac{V_{B'E'}}{V_{AR}}\right). \quad (3a)$$

In some simulations a slightly different expression may be used instead of equation 3a, e.g.

$$q_b = 1 + \left(\frac{V_{B'C'}}{V_{AFO}} + \frac{V_{B'E'}}{V_{AR}}\right). \quad (3b)$$

A good approximation for high collector/emitter voltages, but a bit rough for low collector/emitter voltages is, $$V_{CE} \approx V_{B'C}, \quad (4)$$

$$V_{B'E} \approx 0, \quad (5)$$

and if the equations (2b), (4) and (5) are inserted into equation (3a), the following expression is obtained, $$\frac{1}{q_1} = 1 + \frac{V_{CE}}{V_{AFO}} = \frac{V_{AFO} + V_{CE}}{V_{AFO}}. \quad (6)$$

Equation 6 will be used below when there is an Early voltage that is independent of the collector/emitter voltage $V_{CE}$.

Other models have been developed to remove the deficiencies of the standard Gummel-Poon model (SGP), which have been apparent as process technology has advanced over time.

In IEEE Journal of Solid-State Circuits, Vol 31, page 1476, 1996, by McAndrew et al. an article with the title "VBIC95, The Vertical Bipolar Inter-company Model" was presented, where improvements of the SGP was described. In an other article published in IEEE Transactions on Electronic Devices, Vol 32, page 2415, 1985, written by H. C. De Graaf and W. J. Kloosterman with the title "New Formulation of the Current and Charge Relations in Bipolar Transistor Modelling for CACD Purposes", another transistor model, called Mextram, was described. Amongst other improvements VBIC95 and Mextram includes a varying Early voltage model derived from physical relations.

The invention is not to be considered as a replacement to the above mentioned models, but as a useful complement to the SGP model, as well as other models. This is essential when the modelling of an accurate Early voltage is important or the cause of the Early voltage variation is not easily described by physical based relations.

SUMMARY OF THE INVENTION

When simulating the function of a bipolar transistor in a computer program, for example SPICE model simulation, a transistor normally is characterised by a slightly modified model of the above described Gummel-Poon model. There are several types of SPICE model simulation programs available on the market with one or several simulation models incorporated in the program, for example the Gummel-Poon model and an earlier Ebers-Moll model. The basic Ebers-Moll model does not simulate the behaviour of the Early voltage, but since it is simpler and involves less parameters it may be faster and more robust.

The SPICE model requires that the operator of the simulation give certain values of measured parameters of the bipolar transistors. The problem with the Gummel-Poon model is that it usually does not describe the behaviour of the Early voltage in a complete way, see FIGS. 1a and 1b.

The present invention relates to a problem in simulating bipolar transistors where the Early voltage varies with collector/emitter bias voltages, $V_{CE}$.

Another problem is in simulating bipolar transistors where the Early voltage varies with the substrate potential.

The object with the invention is to improve the standard Gummel-Poon model with an Early voltage extension, where the constant Early voltage is replaced by an Early voltage that is divided into several regions where the Early voltage is adjusted to fit the actual variation of a measured Early voltage characteristics of a bipolar transistor.

In accordance with the invention this object is achieved by means of apparatus incorporating a machine-implemented process that computes the Early voltage characteristics of a bipolar transistor from a set of parameters that may be obtained from direct measurements of the transistor itself.

One way of implementing this is to adjust the value of the Early voltage versus the collector/emitter bias voltages $V_{CE}$ in the following way. At low $V_{CE}$, the constant Early voltage of the SGP model is replaced by a linear dependence on $V_{CE}$. At intermediate values on $V_{CE}$ a constant Early voltage corresponding to the single Early voltage in the SGP model is used. At high $V_{CE}$, the constant Early voltage of the SGP model is replaced with an increased constant value of the Early voltage where the break point between the constant Early voltages is dependent on the substrate potential. The base charge is recalculated from a differential equation, which is solved in each region, and linked together through the choice of boundary conditions. The solution of the differential equation is then included in the mathematical model describing the Early voltage dependency. This improved model is called QTEC.

An advantage of the present invention is an improved collector output characteristics.

Another advantage is that, apart from a few modifications, old parameters from a previous device characterisation against the standard Gummel-Poon model can be maintained.

Yet an advantage is that simple expressions can be used, which will not severely degrade the simulation time or convergence properties.

Yet another advantage is that the invention provides a continues collector current, and the possibility to model continues derivatives as well.

Yet another advantage is that the invention will provide an enhanced simulation model of bipolar transistors, particularly for high voltage bipolar transistors, at all bias conditions.

BRIEF DESCRIPTION OF DRAWINGS

FIGS. 2a and 2b illustrates the basic idea of the invention.

DETAILED DESCRIPTION OF THE INVENTION

Figure 1A:
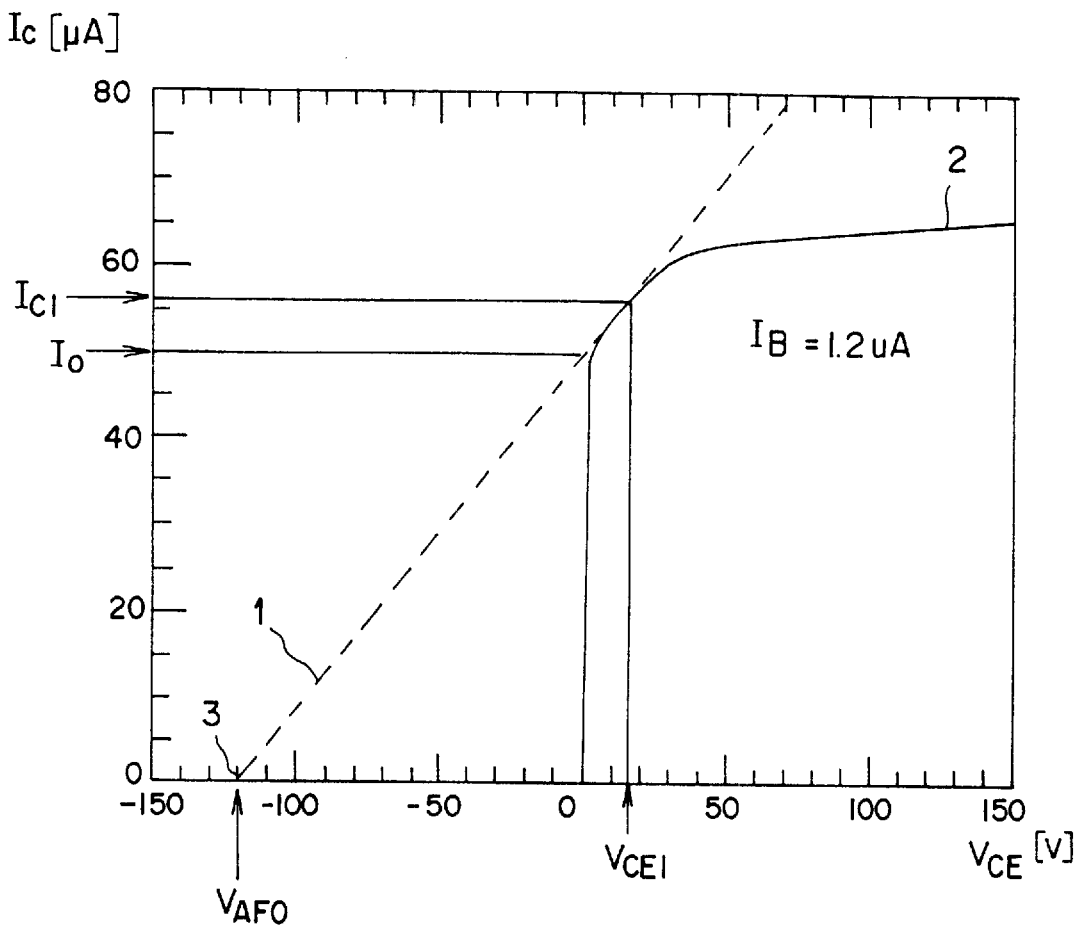
FIGS. 1a and 1b shows the characteristics of an Early voltage in the Standard Gummel-Poon model and measured values from a bipolar transistor designed for high voltage applications.

FIG. 1a shows how a standard Gummel-Poon, SGP, Early voltage, $VAF_0$, is generated from measured values of a bipolar transistor. This is presented in a diagram with emitter/collector bias voltage $V_{CE}$ on the x-axis and collector current $I_C$ on the Y-axis. A straight line 1 is fitted to a measured $I_C$-$V_{CE}$ characteristics curve 2, generated at a base current $I_B$. The intersection with the negative x-axis 3 gives the constant value $V_{AF0}$ used for the SGP Early voltage. The Early voltage is defined as a positive value.

Figure 1B:
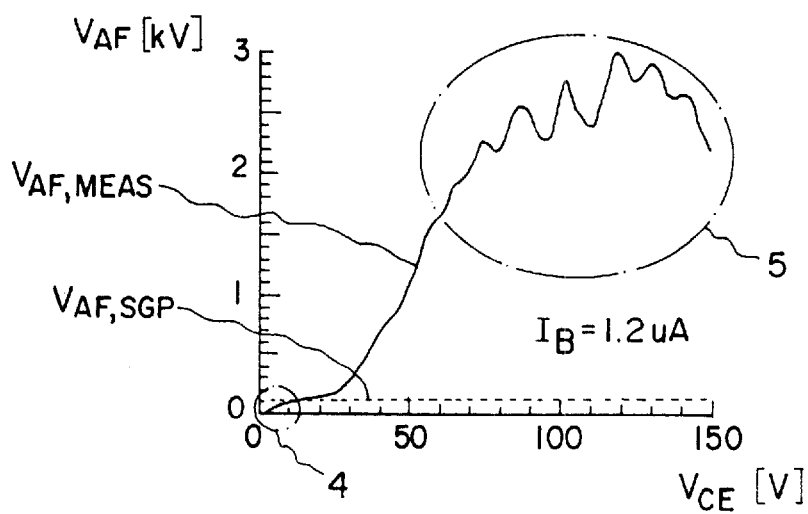

The Early voltage is presented in FIG. 1b, included with the measured variations of the Early voltage $V_{AF,MEAS}$ of a bipolar transistor at the same base current as in FIG. 1a. Two areas where the values of the measured early voltage deviates from the generated SGP Early voltage is found at low values 4 (less than 10 Volts in this example) and at high values 5 (higher than 30 volts in this example) of $V_{CE}$.

The detailed process of the invention uses a set of parameters which are based upon the base charge $q_b$ of Equation (2a). The invention may be most clearly understood by considering the mathematical description of the manner in which the process uses the base charge $q_b$. The derivation of the mathematical expression below is not strictly mathematical and should be used as a way of explaining the mathematical relations.

By defining a new differential equation, $$\frac{dI_c}{dx} = \frac{I_c}{x + V_{Early}(x)} \qquad (7)$$

a new expression for the variable $q_1$ can be calculated which gives a new expression for the base charge $q_b$ used in equation (1). The variable x used in the differential equation may be any variable that in some way is a function of $V_{CE}$, for example, $V_{CE}$ or $V_{B'C'}$ (see equation 4 above). The most convenient variable to use is the collector/emitter bias voltage $V_{CE}$.

The differential equation (7) is easily understood by FIG. 1a as the gradient of the straight line 1, where the Early voltage $V_{Early}(V_{CE})$ depends on the collector/emitter bias voltage.

The Early voltage dependency can be derived from measurements, by adapting mathematical functions, preferable simple functions, to the Early voltages extracted from collector diagrams as shown in FIGS. 1a and 1b. Based on the results from the measurement, and the adapted mathematical functions, the differential equation (7) is solved for each region.

In the dc forward active mode of operation, the total collector current $I_C$ may be approximated by $I_{CT}$ in Equation (1). In order for this assumption to be valid, the approximation have to be in a current regime where the base/collector leakage current as well as the base recombination current may be neglected. Equation (1) can under this assumption and in combination with equation (2b) be modified to, $$I_C = \frac{I_{SS}(\exp(V_{B'E'}/V_T) - \exp(V_{B'C'}/V_T))}{q_1}, \quad (8a)$$

During the process of obtaining a useful mathematical expression another approximation have been done, $$I_0 = I_{SS}(\exp(V_{B'E}/V_T) - \exp(V_{B'C}/V_T)). \quad (8b)$$

A Combination of equation (8a) and (8b) results in, $$I_C = \frac{I_0}{q_1}, \quad (9)$$

which is the expression that is used for calculating the value of the base charge at low injection.

FIG. 2a shows a collector output characteristics that has been divided into an arbitrary number of regions n. In each region, the first part of the base charge $q_1$ is calculated from a specific expression, which may be a constant, or a function of any internal or external variable x. The variable x is usually identical to the collector/emitter bias voltage $V_{CE}$, as used in the examples. However, in general it may be any set of variables. The regions in FIGS. 2a and 2b have break points $x_1, x_2, \ldots, x_i, x_{i+1}, \ldots, x_n$, that may be functions of different variables as well. Region 1 is in the interval $[x_1, x_2]$, region i is in the interval $[x_i, x_{i+1}]$, and so on.

Since the method should be valid for every value on x, adjacent regions must include the common break point. The steep slope in the saturation region 6 of the collector characteristics is not modelled by a low Early voltage but is instead modelled by different current saturation mechanisms, e.g. forward biasing of the internal base/collector junction.

For each new region added to the standard Gummel-Poon model, a subset of new model parameters to the transistor model have to be supplied. In the case of a polynomial expression of order m, $V_{Early,i} = a_0 + a_1 x + \ldots + a_m x^m$, there have to be m+1 new parameters to describe the variations of the Early voltage in the interval $[x_i, x_{i+1}]$. By specifying more boundary conditions at the break points, e.g. the Early voltage should be continuous, the number of parameters can be reduced further. Apart from these parameters, the upper and lower limit of the interval must be supplied.

In each region an expression for the collector current is obtained by solving the differential equation (7). By combining the solution of equation (7) with equation (9), an expression for $q_1$ in region i is obtained. In order to get a continues collector current for all bias conditions, the effective divider $q_1$, in region i is described as a product of several factors, $$q_1(x) = q_{1,1}(x_2) \cdot q_{1,2}(x_3) \cdot \ldots \cdot q_{1,i}(x_i), \quad (10)$$

where $1/q_{1,i}(x_{i+1})$ is the relative increase of the collector current from $x_i$ to $x_{i+1}$. All factors in equation (10) are normalised, thus $q_{1,i}(x_{i+1}) = 1$.

By setting all break points $(x_i)$ to zero, the implementation of the suggested method returns to the ordinary Gummel-Poon model. However, the current level may be shifted slightly. This can be compensated for in the model by a small modification of the forward current gain parameter, usually called BF. All other transistor parameters may keep their standard Gummel-Poon values. Apart from BF, no parameter extracted from a previous characterisation of a transistor with the standard Gummel-Poon model has to be changed. Hence, the extended model does not require a new extraction procedure.

Figure 3A:
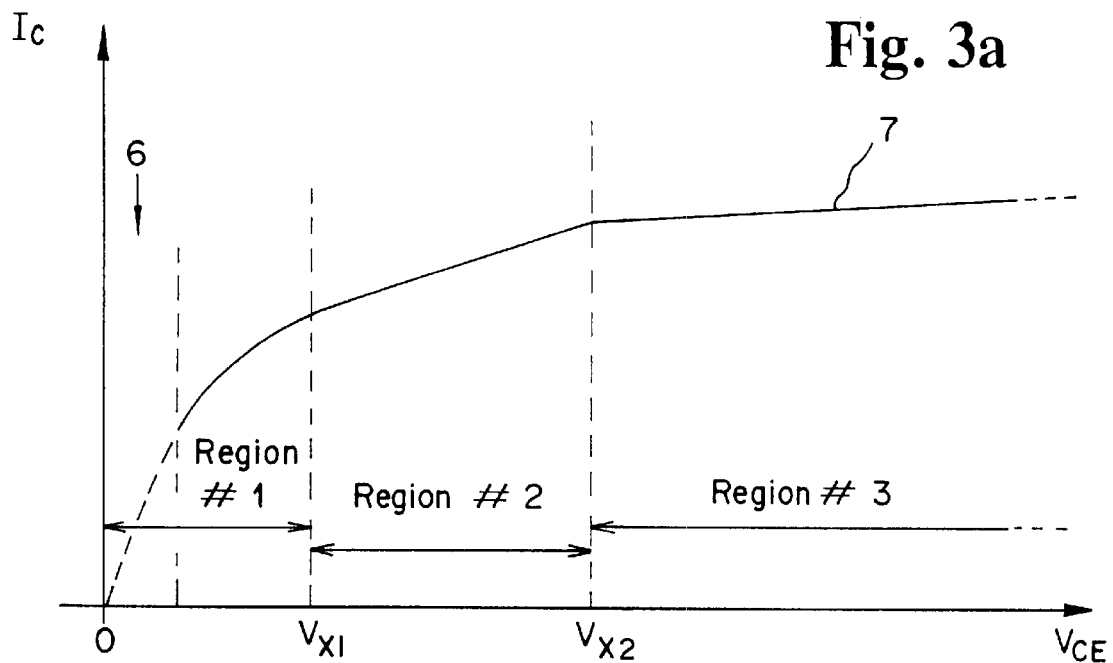
FIGS. 3a and 3b shows in rough outline a $I_C$-$V_{CE}$ characteristics curve and an Early voltage dependency curve of a bipolar transistor designed for high voltage applications.
Figure 3B:
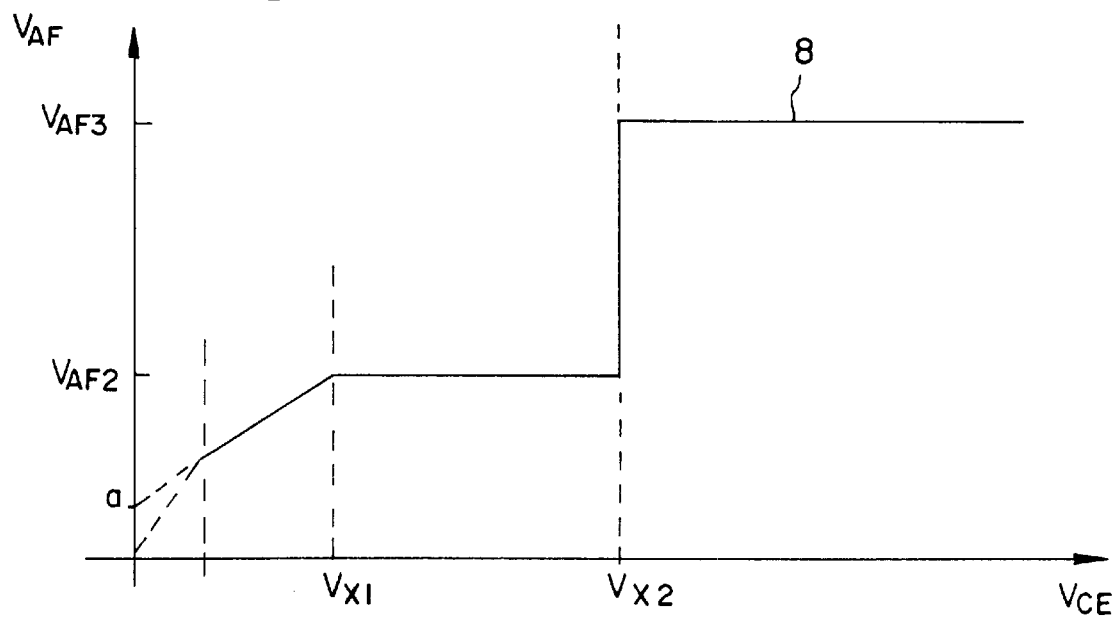

FIGS. 3a and 3b shows in rough outline an $I_C$-$V_{CE}$ characteristics curve 7 and an Early voltage dependency curve 8 of a bipolar transistor, where the curves, in this example, are divided into three $V_{CE}$-regions, region 1, region 2 and region 3. The Early voltage does not have to be a constant value across these regions, as described in the SGP model, but have a collector/emitter voltage dependency in each of these different regions.

Region 1 ($0 \leq V_{CE} \leq V_{x1}$) comprises the saturation region 6 and, as described earlier, this part is modelled by different current saturation mechanisms. The Early voltage $V_{AF1}$ in the remaining part of region 1 can be described with a linear equation, $$V_{AF1} = a + b \cdot V_{CE}, \quad (11)$$

The Early voltage $V_{AF2}$ in region 2 ($V_{x1} \leq V_{CE} \leq V_{x2}$) is equal to the Early voltage for the standard Gummel-Poon model, which means that $V_{AF2} = V_{AF0}$. The Early voltage in region 3 ($V_{CE} \geq V_{x2}$) can be set to a constant value $V_{AF3}$, extracted in the same way as the Early voltage in the standard Gummel-Poon model using the measured $I_C$-$V_{CE}$ characteristics and fitting a straight line to the curve for high values of $V_{CE}$.

The differential equation (7), in region 1, is solved using $x = V_{CE}$ and $y = I_C$, where equation (11) is used for the expression $V_{Early,1}(V_{CE})$. The derivative of the curve has a continuous variation and the differential equation to be solved is, $$\frac{dy}{dx} = \frac{y}{x + V_{FAI}} = \frac{y}{x + a + bx}. \quad (12)$$

$$\int \frac{dy}{y} = \int \frac{dx}{a + (b+1)x}. \quad (13)$$

$$\ln y = \frac{1}{b+1} \ln[a + (b+1)x] + \ln C \quad (14)$$

$$\ln y = \ln C[a+(b+1)x]^{1/(b+1)} \quad (15)$$

$$y = C[a+(b+1)x]^{1/(b+1)} \quad (16)$$

$$y(0) = C \cdot a^{1/(b+1)} = I_0 \Rightarrow C = I_0/a^{1/(b+1)} \quad (17)$$

$$\Rightarrow y = I^0[1 + ((b+1)/a) \cdot x]^{1/(b+1)} \quad (18)$$

Substitute x with $V_{CE}$ and y with $I_C$ and use the expression in equation (9) which results in $$\frac{I_C}{I_0} = \left[1 + \frac{b+1}{a} V_{CE}\right]^{1/(b+1)} = \frac{1}{q_1}. \quad (19)$$

For region 1 the linear Early voltage can be described with three new parameters a, b and $V_{x1}$, where the third $V_{x1}$ can be derived from the other two a and b.

$$a = V_{AF1}(V_{CE} = 0) \quad (20)$$

$$b = dV_{AF1}/dV_{CE}, \quad (21)$$

$$V_{x1} = V_{CE}(V_{AF1} = V_{AF2}) = (V_{AF2} - a)/b, \quad (22)$$

For region 2 and region 3 the constant Early voltage can be described by equation (6), but the expression for the base charge $q_1$ in each region must be modified to take the new base charge expression from the previous region into consideration. The $q_1$-expression for each region is presented in table 1.

TABLE 1

The $q_1$ expression in region 1, 2 and 3

| Region | Mathematical expression |
|---|---|
| 1 | $q_1 = \dfrac{1}{\left[1 + \dfrac{(b+1)}{a} \cdot V_{CE}\right]^{1/(b+1)}}$ |
| 2 | $q_1 = \dfrac{1}{\left[1 + \dfrac{(b+1)}{a} \cdot V_{x1}\right]^{1/(b+1)}} * \dfrac{1}{1 + \left[\dfrac{V_{CE} - V_{x1}}{V_{AF2} + V_{x1}}\right]}$ |
| 3 | $q_1 = \dfrac{1}{\left[1 + \dfrac{(b+1)}{a} \cdot V_{x1}\right]^{1/(b+1)}} * \dfrac{1}{1 + \left[\dfrac{V_{x2} - V_{x1}}{V_{AF2} + V_{x1}}\right]} * \dfrac{1}{1 + \left[\dfrac{V_{CE} - V_{x2}}{V_{AF3} + V_{x2}}\right]}$ |

The break points $V_{x1}$ and $V_{x2}$ can also have a substrate potential $V_S$ dependency which is explained in more detailed below.

Figure 4A:
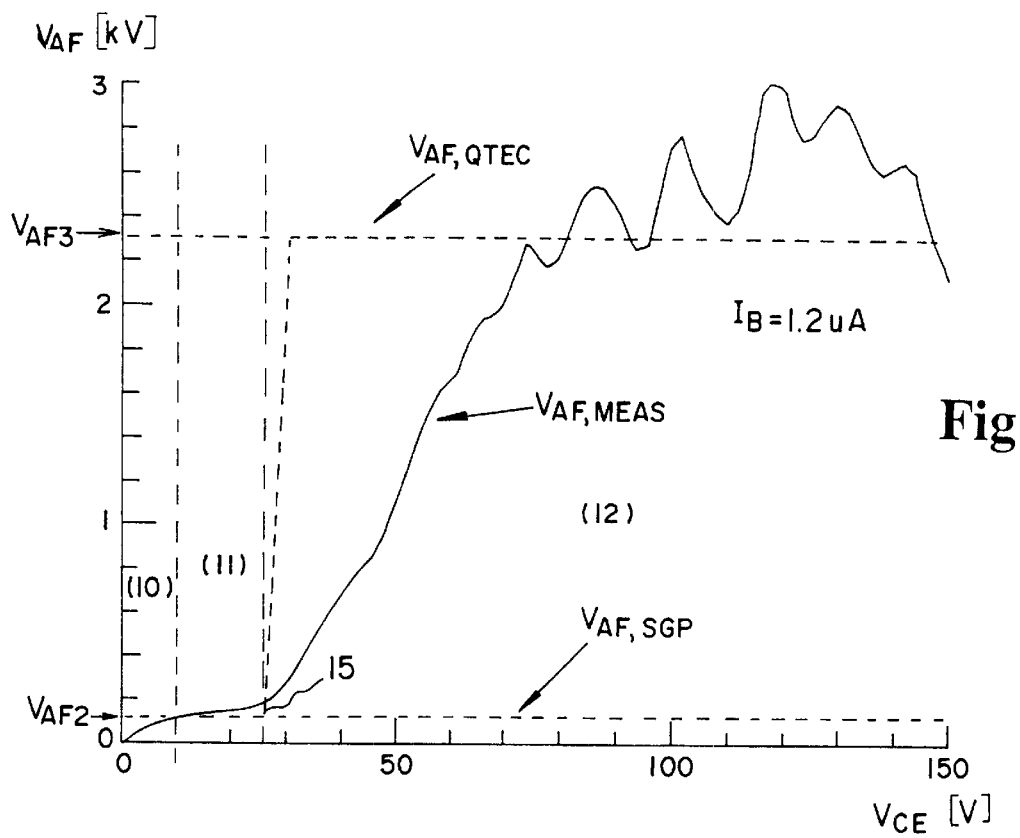
FIGS. 4a and 4b shows an Early voltage of the improved QTEC model compared to the SGP model and measured characteristics.

FIG. 4a shows an improved Early voltage $V_{AF,QTEC}$ in the QTEC model compared to the SGP Early voltage VAF,SGP. The values of the measured Early voltage $V_{AF,MEAS}$ is also shown in the figures and the base current is set to a specific $I_{B=1}$. 2 µA. In this example the bias collector/emitter voltage, $V_{CE}$, is divided into three regions 10, 11 and 12 to better describe the measured Early Voltage with the improved Early voltage model. A first region 10 and a third region 12 show a big difference between Early voltage in the QTEC model and the SGP model, where the QTEC model fits the measured values better. The Early voltage in a second region 11 is identical between the two models and is set to be the constant value $V_{AF2}=V_{AF0}$ from FIG. 1a. Both models show a continuous Early voltage in the first and second region. A closer view of low bias voltage dependency is shown in FIG. 4b, which show a part of the first region 10.

The high bias voltage dependency is clearly shown in FIG. 4a, where the Early voltage in the QTEC model, $V_{AF,QTEC}$, increases abruptly at a break point 15 up to a considerably higher constant value $V_{AF3}$. More regions and/or more complex functions can naturally be added to improve the correspondence between the measured values and the simulated QTEC model values.

Figure 4B:
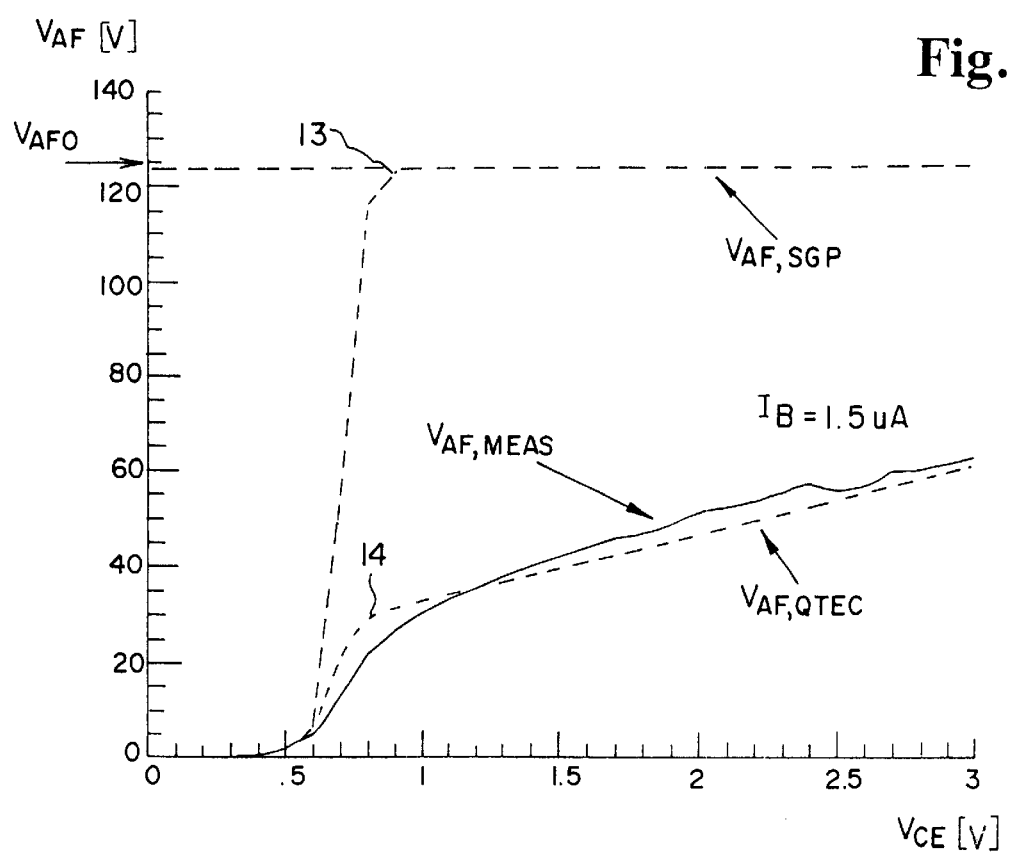

FIG. 4b shows the QTEC Early voltage, $V_{AF,QTEC}$, the SGP Early voltage, $V_{AF,SGP}$, and measured values in the first region for a base current $I_B=1.5$ µA. This figure illustrates simulations of the different models, where the Early voltage of the SGP model $V_{AF,SGP}$ increases rapidly in the beginning up to a point 13 and is thereafter assigned the constant value $V_{AF0}$. The Early voltage of the QTEC model $V_{AF,QTEC}$ increases to a point 14 from where the Early voltage varies linearly until it reach the second region and the constant value $V_{AF0}$ that is equal to $V_{AF2}$.

To generate the simulated curves of the QTEC and SGP model, different expressions for $q_1$, have been used. The QTEC model comprises three different expressions, one for each specific region, where the Early voltage $V_{Early,i}(V_{CE})$ has been derived from measured variations in the actual Early voltage in respective region. The result of the measurement has been used for deriving a mathematical expression. In this case one first degree polynomial and two constants.

The mathematical expression of the Early voltage in the SGP model comprise only of a constant for the whole $V_{CE}$-range.

These mathematical calculations are implemented in an apparatus used for simulating electronic components and circuits. The following figures will illustrate the methods used in that apparatus.

Definition of some terms used in the description:

Transistor model—is a mathematical model of a transistor that can model many different types of transistors. This can for example be a bipolar NPN transistor constructed in a lateral way where the emitter width may vary.

Transistor type—is a type of a transistor that belongs to a specific transistor model. This can for example be the lateral bipolar NPN transistor with a specific emitter width.

Figure 5:
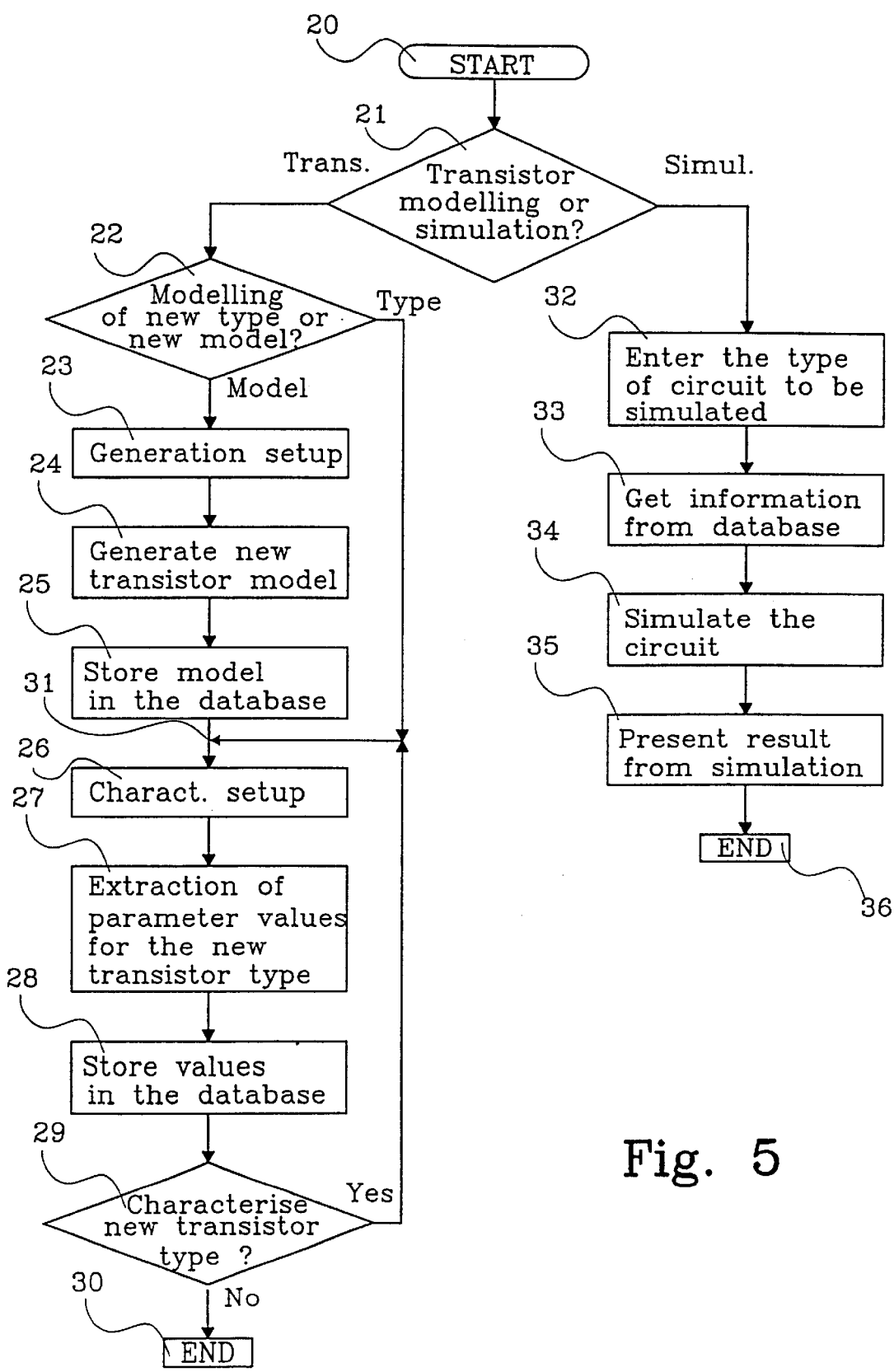
FIG. 5 shows a flow chart over the general function how to characterise a transistor model, extract parameters of a transistor type and simulate a circuit.

FIG. 5 shows a flow chart over the general function how to generate a transistor model, extract parameters of a transistor type and simulate a circuit.

The flow starts in box 20, when either to generate a new transistor model, characterise a new transistor type or to simulate an electronic circuit utilising at least one of the transistor types.

In box 21 a decision is made if to model a new transistor or simulate an electronic circuit. Transistor modelling means generation of a new transistor model and/or characterisation of a new transistor type.

If the answer is transistor modelling, the flow continues to box 22, where a decision is made about what kind of transistor modelling to perform.

The flow continues to box 23, if a new transistor model is to be generated, where a generation set-up is done. This includes that the new transistor model is named and that a transistor, for which a new model is required, is hooked up to the generation equipment.

On the other hand if only a new transistor type is to be characterised the flow is fed to point 31, see below.

The generation of the new transistor model takes place in box 24, where the generation is based on normal parameters in the standard Gummel-Poon model, with some additional parameters according to the invention. The process of obtaining these additional parameters is described in more detail in FIG. 6.

When the new transistor model is generated the transistor model and parameters values are stored in the system database, as described in box 25. When a new transistor model is generated a new transistor type is also characterised.

Every new transistor type is named in the characterisation set-up box 26 and a transistor, that is to be characterised, is hooked up to the characterisation equipment. Information about which transistor model to use is also requested.

The characterisation is processed in box 27, where numeric values for the transistor model parameters are extracted and optimised. These values are then stored in the system database, as shown in box 28.

In box 29a decision is made if to repeat characterisation of a another transistor type. If the answer is no, the flow ends in box number 30. Otherwise the flow is fed back to point 31 and into box 26.

A new transistor model can be modelled by restarting the flow from the start box 20.

If the decision in box 21 is to simulate an electronic circuit, the flow continues to box 32, where information about the circuit with its components is requested.

Information about the components is retrieved from the system database, as shown in box 33 and the electronic circuit is ready to be simulated, which is the next step in the flow 34.

The flow continues to box 35 where the result is presented in a suitable way and the simulation ends in box 36.

Figure 6:
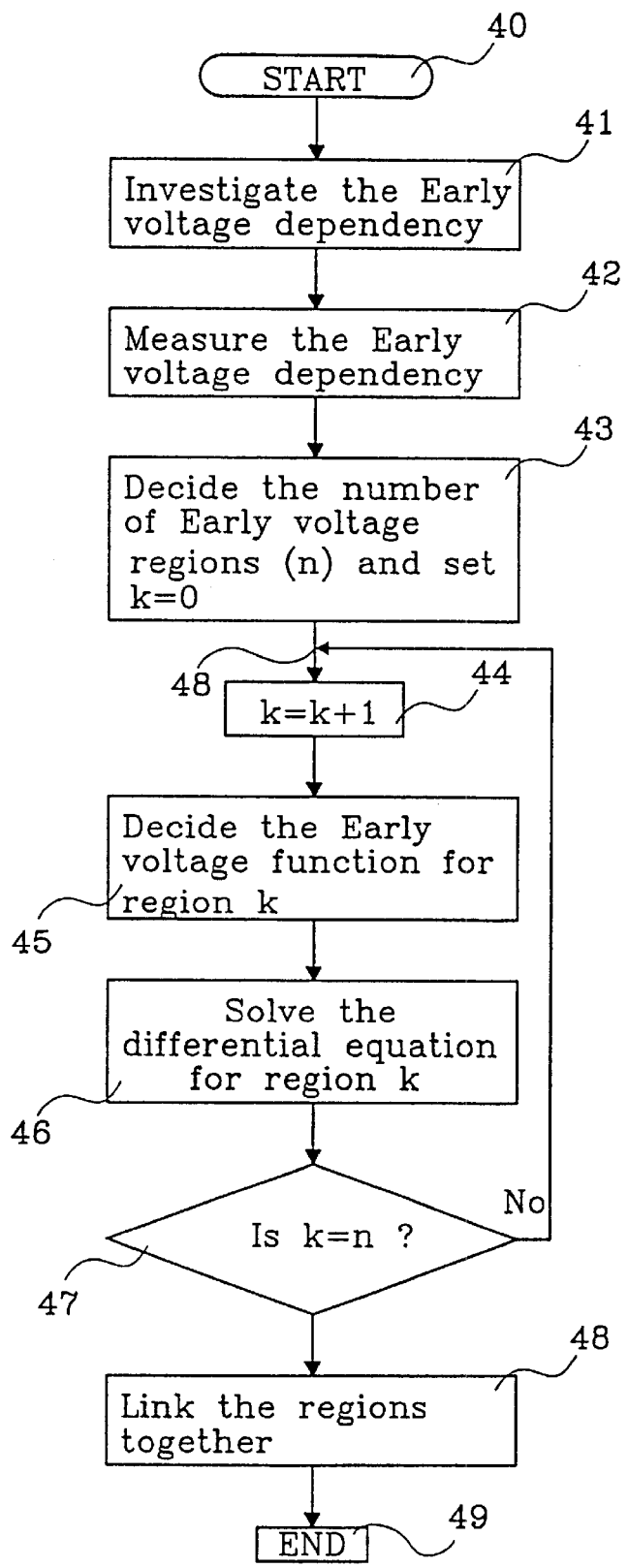
FIG. 6 shows a flow chart over how to generate additional parameters in a new transistor model, where the additional parameters describe the Early voltage dependency of a bipolar transistor.

FIG. 6 show a flow of how to generate additional parameters in a new transistor model, where the parameters describe the Early voltage dependency of a bipolar transistor. The process described is just a part of the overall process of determining the parameters in a bipolar transistor. The other parameters are obtained according to the standard Gummel-Poon model and is not a part of this description. The process in how to obtain an improved agreement between measured and modelled Early voltages in the Gummel-Poon bipolar transistor model starts in box 40.

The Early voltage needs to be measured, but first a variable of interest x must be determined. This takes part in box 41, where an investigation and a selection of the variable is done.

The process proceeds to box 42, where the Early voltage is measured versus the variable of interest x, usually the collector/emitter voltage $V_{CE}$.

The measured characteristics of the Early voltage is divided into a number of regions n, as previously described, when the process reach box 43. An integer k is set to zero, k=0.

The integer k is increased by one in box 44 and the flow continues to box 45, where a mathematical function is fitted to the measured Early voltage characteristics in the first region.

The mathematical function for the Early voltage $V_{Early}(x)$ is entered in the differential equation (7), which is solved, analytically or numerically, in the first region. This takes part in box 46. The result of this calculation is stored and the flow continues to box 47, where the value of the integer k and the number of regions n are compared. If n>k, the flow is fed back to point 48 and the calculation for region two is done.

This loop continues until n is equal to k, n=k, and then the flow continues to box 48, where the different regions are linked together through choice of boundary conditions. The solution is included into the standard Gummel-Poon model by modifying the variable $q_1$ as described previously.

The process ends in box 49 and the new expression for $q_1$ is used in equation (2a).

Figure 7:
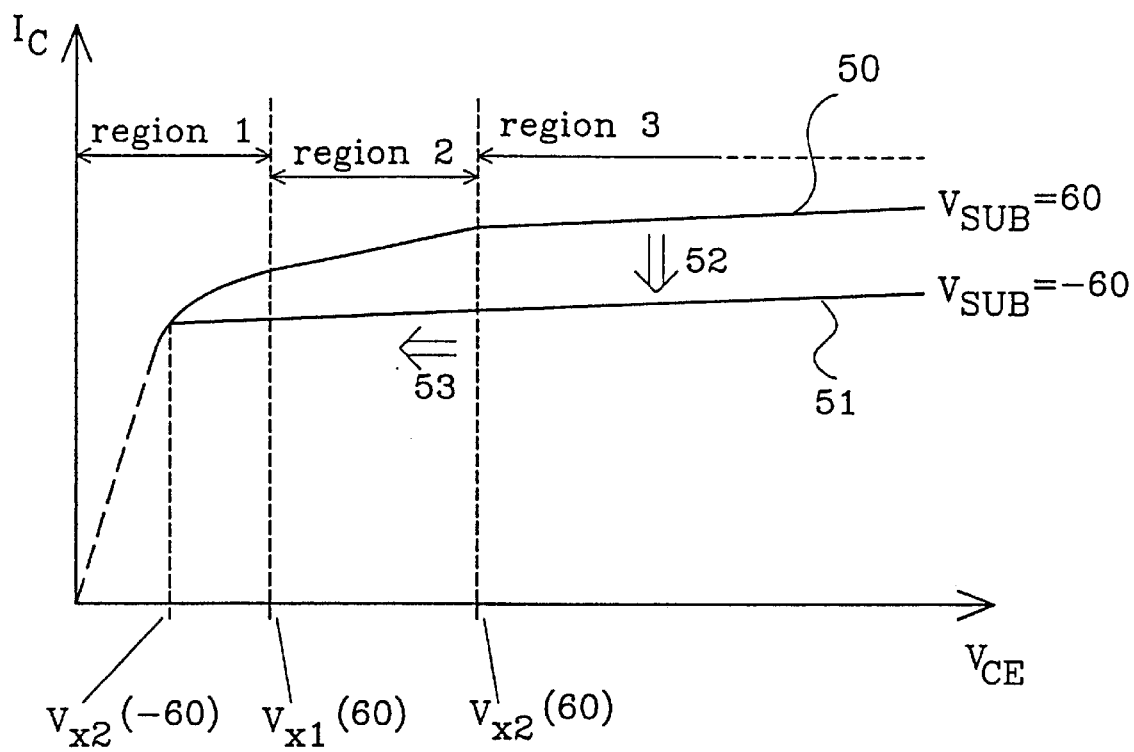
FIG. 7 shows a rough outline of two $I_C$-$V_{CE}$ characteristics curves, where the break points $V_{x1}$ and $V_{x2}$ have a substrate potential Vs dependency.

As mentioned before, the break points $V_{x1}$ and $V_{x2}$ have a substrate potential Vs dependency and FIG. 7 shows in rough outline two $I_C$-$V_{CE}$ characteristics curves.

A first curve 50 is describing the Early voltage at a substrate potential $V_S$=60 volts. The break points $V_{x1}(60)$ and $V_{x2}(60)$ are indicated in the figure.

A second curve 51 is describing the Early voltage at a substrate potential $V_{S=\_60}$ volts. The first break point $V_{x1}(-60)$ can not be seen and the second break point $V_{x2}(-60)$ is indicated in the figure at a lower $V_{CE}$ than the first break point $V_{x1}(60)$ for the first curve 50.

When the substrate potential is decreasing from 60 to −60 volts, the gradient of the first curve in the third region is constant but the value of the collector current in that area is reduced 52. The second break point $V_{x2}$ is shifted towards a lower $V_{CE}$ 53 at the same time.

Eventually, at a specific substrate potential $V_{S=VS1}$, the second region has the same gradient as the third region and the value of $V_{x1}(60)=V_{x2}(V_{S1})$. Only two regions are then necessary for calculating the base charge.

The very high Early voltages at high $V_{CE}$ only appears in some types of bipolar transistors and one type of transistor is described in the Swedish patent application SE9604142-1. This bipolar transistor works in a lateral way.

What is claimed is:

1. A method for improving simulation of a bipolar transistor by improving an expression of base charge, where the expression of the base charge, which describes the variation of Early voltage, for the bipolar transistor varies and the Early voltage is dependent on at least one variable, said method comprising the steps of:

measuring the Early voltage as a function of said variable;

fitting a mathematical function to the measured Early voltage such that the deviation between measured and simulated characteristics of the bipolar transistor decreases;

inputting the mathematical function for the Early voltage into a differential equation to obtain an improved expression for the base charge, wherein the differential equation is expressed as:

$$dLc/dx=I_C[x+V_{Early}(x)]$$

where $I_C$ is the bipolar transistors collector current and x is a variable dependent on a collector/emitter voltage and $V_{Early}$ is the Early voltage;

dividing collector output characteristics of the measured Early voltage, with respect to the variable, into a plurality of arbitrary regions; and fitting a mathematical function within each of the regions.

2. The method of claim 1, further comprising the step of:

linking the regions together by choice of boundary conditions.

3. The method of claim 1 wherein the simulation is based on a Standard Gummel-Poon model.

4. The method of claim 3, wherein a collector/emitter bias voltage is selected as the variable.

5. The method of claim 3, wherein the variable is selected as being dependent on a substrate potential.

6. A method for improving a system simulating an electronic circuit utilizing at least one bipolar transistor by improving an expression of base charge of the bipolar transistor, where the expression for the base charge describes how Early voltage for the bipolar transistor varies, and where the Early voltage is dependent on at least one variable, said method comprising the steps of:

generating a transistor model;

characterizing parameters of at least one bipolar transistor corresponding to the generated transistor model; and simulating the electronic circuit utilizing at least one bipolar transistor described by the transistor model, wherein the generation of the transistor model further comprises the steps of:

measuring the Early voltage as a function of said variable;

fitting a mathematical function to the measured Early voltage such that the deviation between measured and simulated characteristics of the bipolar transistor decreases;

inputting the mathematical function for the Early voltage into a differential equation to obtain an improved expression for the base charge, wherein the differential equation is expressed as:

$$dIc/dx=I_C[x+V_{Early}(x)],$$

where $I_C$ is the bipolar transistors collector current and the variable x is dependent on a collector/emitter voltage and $V_{Early}$ is the Early volt age;

dividing a collector output characteristic of the measured Early voltage with respect to the variable into a plurality of arbitrary regions; and fitting a mathematical function within each of the regions.

7. The method of claim 6, further comprising the step of linking the regions together by choice of boundary conditions.

8. The method of claim 6, wherein the simulation is based on a Standard Gummel-Poon model.

9. The method of claim 8, wherein a collector/emitter bias voltage is selected as the variable.

10. The method of claim 8, wherein the variable is selected as being dependent on a substrate potential.

11. An apparatus for improving simulation of a bipolar transistor by a means for improving an expression of base charge, wherein the expression of the base charge, which describes the variation of Early voltage, for the bipolar transistor varies and the Early voltage is dependent on at least one variable, the apparatus comprising:

means for measuring the Early Voltage as a function of said variable;

means for fitting a mathematical function to the measured Early voltage such that the deviation between measured and simulated characteristics of the bipolar transistor decreases;

means for inputting the mathematical function for the Early voltage into a differential equation to obtain an improved expression for the base charge;

a means for calculating the improved expression for the base charge based on the differential equation expressed as:

$$dI_C/dx = I_C/[x + V_{Early}(x)]$$

where $I_C$ is the bipolar transistors collector current and the variable x is dependent on a collector/emitter voltage and $V_{Early}$ is the Early volt age;

a means for dividing a collector output characteristic from the measured Early voltage, with respect to the variable, into a plurality of arbitrary regions; and means for fitting a mathematical function within each of the regions.

12. The apparatus of claim 11, further comprising:

a means for linking the regions together by choice of boundary conditions.

13. The apparatus of claim 11, wherein the simulation is based on a Standard Gummel-Poon model.

14. The apparatus of claim 13, wherein the collector/emitter bias voltage is selected as the variable.

15. The apparatus of claim 13, wherein the variable is dependent on a substrate potential.

16. A system for improving simulation of an electronic circuit utilizing at least one bipolar transistor, by a means for improving an expression of base charge, where the expression for the base charge describes a variation of Early voltage for the bipolar transistor, and the Early voltage is dependent on at least one variable, the apparatus comprising:

means for generating a transistor model;

means for characterizing parameters of at least one bipolar transistor corresponding to the generated transistor model;

means for simulating an electronic circuit utilizing at least one bipolar transistor described by the transistor model;

means, within the transistor model generation, for measuring the Early voltage as a function of said variable;

means for fitting a mathematical function to the measured Early voltage such that the deviation between measured and simulated characteristics of the bipolar transistor decreases;

means for inputting the mathematical function for the Early voltage into a differential equation to obtain an improved expression for the base charge;

a means for calculating the improved expression for the base charge based on the differential equation expressed as:

$$dI_C/dx = I_C/[x + V_{Early}(x)]$$

where $I_C$ is the bipolar transistors collector current and the variable x is dependent on a collector/emitter voltage and $V_{Early}$ is the Early voltage;

a means for dividing a collector output characteristic for the measured Early voltage with respect to the variable into a plurality of arbitrary regions; and a means for fitting a mathematical function within each of the regions.

17. The system of claim 16, further comprising means for linking the regions together by choice of boundary conditions.

18. The system of claim 16, wherein the simulation is based on a Standard Gummel-Poon model.

19. The system of claim 18, wherein the collector/emitter bias voltage is selected as the variable.

20. The system of claim 18, wherein the variable is dependent on a substrate potential.

* * * * *